United States Patent [19]
Hartmann et al.

[11] Patent Number: 5,900,289
[45] Date of Patent: May 4, 1999

[54] METHOD OF PRODUCING A COLORATING COATING

[75] Inventors: Rolf Hartmann, Kelkheim/Ts.; Werner Ronge, Mörfelden-Walldorf; Armin Tschentscher, Flörheim, all of Germany

[73] Assignee: ANTEC Angewandte Neue Technologien GmbH, Kelkheim/Ts., Germany

[21] Appl. No.: 08/758,413

[22] Filed: Nov. 29, 1996

[30] Foreign Application Priority Data

Nov. 29, 1995 [DE] Germany .......................... 195 44 498
Jun. 12, 1996 [EP] European Pat. Off. .............. 96109376

[51] Int. Cl.$^6$ .................................................. C23C 16/32
[52] U.S. Cl. .......................... 427/577; 427/578; 427/249; 427/255.2; 427/162; 427/166; 427/167
[58] Field of Search .................................. 427/577, 578, 427/249, 255.2, 162, 166, 167

[56] References Cited

U.S. PATENT DOCUMENTS

| | | | |
|---|---|---|---|
| 4,170,460 | 10/1979 | Donley | 65/30 R |
| 4,545,646 | 10/1985 | Chern et al. | 350/162.2 |
| 5,198,285 | 3/1993 | Arai et al. | 428/216 |
| 5,462,775 | 10/1995 | Yamada et al. | 427/573 |
| 5,580,364 | 12/1996 | Goodman et al. | 65/60.2 |

FOREIGN PATENT DOCUMENTS

| | | |
|---|---|---|
| 0267679 | 5/1988 | European Pat. Off. . |
| 3202709 | 8/1983 | Germany . |
| 4344300 | 11/1992 | Japan . |
| 2165266 | 4/1986 | United Kingdom . |

*Primary Examiner*—Shrive Beck
*Assistant Examiner*—Timothy Meeks
*Attorney, Agent, or Firm*—Lane, Aitken & McCann

[57] ABSTRACT

A method of producing a thin coating by plasma-assisted chemical vapor phase deposition from a carbonaceous and metalliferous gas phase of a predetermined composition on a substrate surface especially in the form of a diamond-like carbon-silicon-hydrogen compound, wherein for the coloration the optical thickness of the coating or of one layer region or of a plurality of layer regions of the coating each, is predetermined in one single vacuum coating process in that due to interferences of the first order and/or of a higher order the desired color impression results at the coating or at its layer region(s) according to the principle of interference at thin films, and in the portion of the coating adjacent to the substrate surface first of all a non-colorating layer region, providing hardness and wear resistance of the complete coating, is produced with a larger thickness in relation to the colorating region or regions, wherein preferably shortly before achieving the total thickness of the coating the composition of the layer-forming gas phase is continuously or stepwise changed in that, in addition to the colorating layer regions to be deposited thereon, at least one gradient of the layer composition and of the refractive index is formed causing an optical reflection boundary surface.

21 Claims, No Drawings

METHOD OF PRODUCING A COLORATING COATING

The invention concerns a method of producing a colorating coating according to which by means of a CVD process of the thin-layer techniques a layer of a carbonaceous and metalliferous, especially siliceous working gas is deposited. The process serves for the coloration of objects having a wide color palette on any substrate surface upon the production of a layer providing the coated objects preferably simultaneously and independent of the corresponding color impression with an efficient wearing and with corrosion protection of a high hardness. Said layer can be produced colored in rainbow colors up to dark black, in color courses with a soft color transition or structured color figures or up to hard color contrasts in different brightnesses of color or degrees of darkening, in an iridescent appearance.

The invention is based on a method with the features as they are known for example from EP 0 509 875 A1.

With regard to the conventional coloration of objects by applying body color (e.g. by varnishing), relatively thick and soft layers with a thickness of at least some micrometers always arise, with the surface always showing more or less its peculiar structure (orange skin) and usually the known problems are to be considered by means of solvents. The produceable colors are body colors, and their luminous power is naturally limited. Color varnishes are, compared to hard solids layers, very soft and not sufficiently wear resistant.

With regard to PVD-hard solids layers, the color spectrum is limited to the typical body colors of said materials. Furthermore, hard solids layers are hardly suitable as corrosion protection due to their columnar microstructure.

As is generally known, parts of aluminum materials can be inked by special anodizing processes, whereby relatively thick and hard surface layers are produced. Said layers are without their own peculiar structure, they can also be subsequently inked, however, in their application they are limited to aluminium materials.

Soft color courses can not or only in a very limited way, be realized by means of anodizing processes, which reach a high surface hardness. Varnishing processes, which enable color courses, provide layers which, as already mentioned, are again very soft and not wear resistant.

Iridescent color impressions on metallescent surfaces are already produced by applying multilayer systems which usually consist of alternating layers of oxidic or fluoridic metallic compounds of different refractive indices. The color impression so produceable has a high luminous power due to the optical reflection. However, applying a sequence of a plurality of thin layers, the relative thickness of which being exactly adapted to each other, is necessary. In the reference of G. Kienel "Vacuum Coating No. 5, Applications Part II" of the VDI publishers (1993) on page 84, the production of iridescent layers on the basis of an odd number of alternately thermically evaporated layers of zinc sulphide and magnesium fluoride is described. Piles of layers of said kind do not offer considerable wear and corrosion resistance.

Coloured coatings can also be produced by putting metallic particles into a colourless layer. However, the spectrum of the so produceable body colors is limited to the typical colors of the metals.

The object underlying the invention is to provide a method of producing a colorating coating which avoids the above-mentioned disadvantages and especially the one of being limited to typical body colors.

According to the invention, a coating is produced which is deposited in a vacuum under the influence of an electrically excited plasma discharge from a carbonaceous and metalliferous working gas, especially with the metal silicon or with a metal having basically the same effects as silicon, up to a predetermined thickness on the parts to be coated.

The method according to the invention enables, in contrast to the state of the art, an easily implementable and concerted coloration with regard to different substrates without any restriction in the color palette, e.g. to body colors or complicated layer arrangements of different materials etc., working in an easy, solvent-free, cold way and not harmful to the environment and producing thin layers which do not impair the surface structure of the parts as a finish. At the same time, the objects being coated therewith receive an increased resistance against environmental influences and corrosion.

Surprisingly, it was also able in the single colorating vacuum coating process to increase the hardness and the wear resistance of the coating considerably and at the same time to produce a single hard and wear resisting, as well as corrosion proof, layer with a colorating region firmly and stably integrated therein. In other words, contrary to the previous experiences with common thin interference layers, it was possible to produce a relatively thick and wear resisting layer additively with a coloration, and thus to produce the interference coatings according to the invention also with an extraordinary hardness, resistance and stability.

Therefore, according to the invention, one or more gradients defined in a predetermined way (stepwise or continuously) are produced in the growing layer by varying the coating parameters, especially the composition of the layer-forming gas phase and/or the electrical parameters of the energy supply. Said gradients affect the optical characteristics of the coating in such a way that layers or regions of different refractive indices grow, at the optically reflecting boundary layers of which the colorating interference effects result. Thus, the coating is adjusted in the non-colorating layer region and in the colorating layer region or regions such that the desired hardness and wear resistance are achieved, that on the one hand the different refractive indices of the layer regions result and on the other hand the hardnesses of said layer regions do not essentially differ from each other and that said layer regions are integrally joined undetachably to each other.

The colorating or color-determining zone of the coating thus is an integral part of the protective coating, it shows the same mechanical characteristics (hardness and wear resistance) as the coating and can practically not be removed therefrom. According to previous experiences, in case of extreme, mechanical stress and loadings of an object coated according to the invention, first of all the basic material is damaged and sackens, before the coating or parts thereof can be detached.

The complete thickness of the coating is adapted to the corresponding requirements concerning wear resistance independently of the desired color, which is produced at the end of the coating process.

In other words, first of all it is coated to a preferably essentially black diamond-like layer of a thickness of some $\mu$m of the desired hardness. Then, shortly before the end of the coating process, the coating parameters are varied in the above defined way at least with one refractive index step or continuous refractive index gradient after which the coating process is continued until the desired color impression appears, whereupon, as desired, subsequently one more or a plurality of further colorating layers are applied, respectively after corresponding refractive index gradients, which create the necessary reflection boundary layers.

However, numerous coating systems differently produced by the inventors had not lead to such constant, hard and at the same time colored coatings. Thus, for example supplementarily colored diamond-like interference coatings were deposited after already having applied a reflecting interlayer on a wear resisting hard, diamond-like layer, or the interference layers were coated with various colorless layers. However, in case of a loading and mechanical stress said layer bonds were destroyed and the colorating coating could not be achieved with the desired hardness and wear resistance.

A further advantage of the method according to the invention is that by means of an integration into the thicker wear resisting layer, one becomes mostly independent of the substrate surface, and especially no reflective (e.g. expensively polished) substrate surfaces are required as optical boundary layer for the interference effect.

The type of the layer used according to the invention is based on the plasma assisted vapor phase deposition of metalliferous siliceous diamond-like carbon. Using layers of diamond-like carbon for the surface refinement has been known for some time. These basically black layers are wear resisting and friction resisting and are characterized by a high hardness. An important application field is, therefore, coating for reducing friction and wear especially with regard to moved component parts. It has been established to deposit the friction reducing layers by means of an electrical gas discharge from a gas phase of a suitable composition according to the PACVD method (Plasma Assisted Chemical Vapor Deposition). Also in reference EP 0 182 889 B1 such a method is mentioned, which principally is also used in the present invention, so that for the disclosure of the basic course of the process, EP 0 182 889 B1 is expressly referred to.

The method according to EP 0 182 889 B1 is worked with a working gas of a pure hydrocarbon gas and of pure hydrogen without any addition of silicon, to which, if necessary, only inert gases are added. Thus, according to the specification, on glass bodies, special steel, aluminum or ceramics, hard and wear resistant, but always brown to dark black, diamond-like layers can be achieved, which are not suitable for a freely-selected coloration.

It was found out that layers produced according to such a method, especially with regard to critical substrates such as case-hardened steels and cupriferous alloys, showed an insufficient or even no adherence at all, as these layers often show internal compressive stresses.

By adding suitable metals such as, especially, silicon to the carbonaceous depositing gas, applying layers decreasing friction and wear also to technical base materials which are considered not to be coatable or which are hardly uncoatable, such as carbonized or nitride steels and cupriferous compounds has been achieved. Among other things said addition of silicon is described: for reducing the friction coefficient of the produced layers in reference EP 0 435 312 A1, for improving the adherence on the substrate in reference DE 38 38 905, in connection with methane for reducing the substrate temperature during the coating in reference U.S. Pat. No. 4,873,114 and as an addition when producing layers of a diamond-like carbon by means of LECVD (Laser-excited Chemical Vapour Deposition) in reference U.S. Pat. No. 5,094,915. In this connection, mostly black layers of a thickness of some micrometers are produced. With regard to thinner layers, more or less dirty yellow to brown body colors of the layer have been noticed in the state of the art (e.g. EP 0 509 875 A1).

In DE 41 00 584 A1, reference was made to inking subjects. The aim of the corresponding proposal was to recognize wearing regions early, when a sub-layer inked in gold and marked becomes visible under the silicon-free diamond-like protective layer after its degradation and removal.

The addition of silicon according to the invention, however, serves for the technical purpose of the improved adherence, also on critical substrates or of the reduced friction coefficient, and the silicon itself does not effect a coloration in the meaning of an additional introducing a body color.

According to the invention an essentially diamond-like and thus high-refractive layer, preferably of a carbon-silicon-hydrogen-mixture, is deposited from a carbonaceous and siliceous gas phase of a special composition on the substrate surface for the coloration of e.g. metallic substrates in a single vacuum process by means of plasma assisted chemical vapor phase deposition and in which, by variation of the composition, regions or zones are produced which are separated by means of optical transitions. The coherent and continuous coating thus is divided into regions which cannot be mechanically separated from each other and which have different functions: a protective region, the thickness of which is chosen according to the requirements of wear and corrosion resistance, and one or a plurality of colorating regions with an optical effect but with practically the same hardness.

The resulting color impression is principally defined by the thickness of the layers and by the relation of the various regions with regard to their individual thicknesses. Thus, the layer thickness of the colorating layer region or regions is adjusted such that the optical path length difference of the light reflected at the front and at the back face of the region and being effected by said layer thickness amounts, according to the rules of optics, corresponds with the single-value or integral multiple of the wave length or of half of the wave length of the desired color impression, respectively. Thus, the optical path length difference $n\Delta x$, which corresponds to the optical thickness of the layer, lies for the first order of the interference in a range of about 0.5 $\mu$m. The real physical layer thickness of such a colorating portion then lies with a refractive index around n=2 in the range of about 0.1 $\mu$m. The thickness of the complete coating with the integrated colorating regions lies, dependening on the requirements concerning the protective effect, in the range of about 0.1 $\mu$m up to some micrometers and is selectable according to the requirements of wear resistance, independently of the desired color impression.

With regard to wear resistant, hard, colored layers, the lower non-colorating region principally may be as thick as possible, whereas in practice a thickness of about 1 to 10 $\mu$m is useful.

Since the thickness of the colorating region is very small, for example, about 0.1 $\mu$m, relative to the thickness of the non-colorating region, the layer thickness of the total system is about 1 to 10 $\mu$m. The noncolorating layer region can be applied as a not necessarily optically translucent portion in the visible portion.

The basis of the arising color impression are the known optical characteristics of thin films. Caused by interference effects, the light wave length is preferably reflected the path difference of which amounts to a complete wave length with regard to the reflection at the front and back portion of the colorating coating or of the colorating layer region, respectively. If the path difference amounts to a multiple (interference of a higher order), the color impression can be changed by interference with other, also interfering wave lengths of the light, and it can be adjusted as desired. The conditions for the realization of an intensive color effect according to the invention are high refractive index differences at the layer boundary surfaces, combined with a low extinction with regard to the desired wave length. The color impression then results from the superposition and interference of the first order light and/or higher order light reflected at the various boundary surfaces.

Layers of pure diamond-like carbon without an addition of silicon are already very dark in a low layer thickness and soon they reach a deep black color. Interference effects of a higher order fail with regard to said feature due to the dark inherent color of the layer. In the state of the art, regularly black scratch-resistant and wear resisting layers are produced, which are also not suitable for a freely-selectable coloration.

By adding metals such as silicon to the layer system of diamond-like carbon, as has already been described for the reasons of improving the protective layers against wear resistance in the field of tribology, surprisingly the extinction of thin layers can be reduced so far that very efficient interference effects not only of the first order, but also of a higher order, that means mixing interferences, are made possible. During the procedure, while applying the colorating layer region integrated in the coating, the chromatic circle or color spectrum can be passed through purposefully for a number of times and the coating process can be stopped when the desired color impression is achieved. Due to the continuous, easily automatable control of the color impression while the layers grow, the desired color impression can exactly be reproduced even in case of a fluctuation of the layer parameters. Thus, this method is considerably simplified compared to the previous complicated layer systems.

Besides silicon, those metals are possible as suitable metals and metals having the same effects which, depending on their concentration, define the refractive index in the corresponding layer region and which do not change or hardly change the hardness of the coating as well as which lead to coatings that possibly adher to many materials. The interior stress of the layer possibly should also be reduced as with regard to silicon. Possible alternatives for silicon are for example wolfram, tantalum and boron.

When preparing the method it was found that starting materials of the highest purity are not necessary. All coatings can be performed with substances of technical purity (laboratory quality). The coating process can be performed within a wide range of pressure. The working range suitably lies between about 0.005 and 1 mbar, preferably at an overall pressure of about 0.05 mbar. The coating is performed from the gas phase without using solid sources, as described in EP 0 182 889 B1, in order to be able to perform an efficient, universally homogeneous coating even of subjects having a complicated form. The addition of silicon preferably is not effected in the form of a self-inflammable hydrosilicon gas, but as a vaporable silicon-organic composition, which is added to the gas that supplies the carbon or which is fed separate from said gas, so that the mixing in the recipient only takes place immediately before the coating process. As starting materials preferably ethine and hexamethylene disiloxane vapor are used; chemically similar and related compounds also lead to the desired success in case of correspondingly adapted deposit parameters.

Thus, the silicon is added preferably in the form of a vapor of one of the silicon-organic compounds hexamethyl-disilane (HMDS), tetramethyl-silane, hexamethyl-disiloxane (HMDSO), tetraetoxisilane (TEOS) and tetramethyl-silazane to the other working gas substances, which may also comprise inert gases and hydrogen besides the carbon sources, such as ethane, ethene, ethine or aromatic compounds as benzene or the components are supplied at different admission places into the vacuum recipients.

According to a preferred version of the method, the working gas of ethine, hydrogen and hexamethyl-disiloxane is composed with a molar mixing relation in that, referred to the amount of the hydrocarbon gas ethine, set to 1, the parts of hydrogen lie between 1 and 0.01 and the parts of hexamethyl-disiloxane lie between 0.5 and 0.005. Further vapors of metal-organics, which cause similar conditions as the siliceous parts, can also be added or even be used alternatively. For producing the described gradients in the composition and in the optical refractive index of the layers or of the layer regions, the gas composition is purposefully varied within the above-mentioned limits.

Thus, first of all a refractive index step sufficient for the correspondingly desired reflection degree is produced, however without producing a considerable jump or step in the mechanical characteristics (hardness).

Refractive index steps were empirically determined for different gas compositions based on different requirements on the mechanical characteristics of the coating, which cause the desired color effect each. Then, the mechanical characteristics of said colored coatings were tested. The coherence of the layer system based on a predetermined mechanical loading served as a criterion for useful refractive index steps or gradients, respectively. Depending on the kind and intensity of the color brightness, a desired and purposeful variation of the refractive index step or gradient, respectively, can be chosen, reaching from an absolute to a partial reflection with a correspondingly darker shading of the color impression. This is purposefully used for influencing the color brightness, in order to increase the number of the realizable colors. The expert, having the parameters for influencing the layer hardness at his disposal for the underlying diamond-like layers, can easily determine the best values for his corresponding purposes (hardness, shade and intensity of color) based on the given essential method.

If, for producing the desired reflection surface, a layer of a deviating, lower refractive index is produced, a total reflection according to the rules of optics may occur on suitable conditions at this layer. However, if said interlayer is made very thin (clearly less than a wave length), the so-called diminished total reflection occurs; the reflection degree is reduced, the ground is translucent. According to the invention, not only very bright colors but also saddened colors of a very noble appearance can be produced in this way, whereby the wave length dependency of the effect can be used as a further parameter for controlling the color impression.

Various simple steps, double steps or multiple steps of the refractive index arranged one behind the other (both with decreasing and increasing gradients) were realized, whereas it always is to be ensured that the light transmitted on the coated substrate finds at least one reflection surface to an optically thicker medium. If the refractive index or the composition is constantly changed during the epitaxial growth of the layer, a plurality of reflection boundary surfaces lying differently deep into the direction of the layer thickness are obtained at the same time.

The coating can be adjusted locally by varying the interference determining layer thicknesses by means of influencing the depositing conditions, in that colored figures in color courses with soft color transitions or structured color effects occur. The adjustment is made by influencing the gas supply direction and/or the electrical fields which determine the deposition.

For the optical efficiency of the coating according to the invention, the electrical plasma excitation is selected so that the diamond-like character of the layer results. In the embodiments the plasma was excited with high-frequency energy (13.56 MHz), whereby due to the special kind of the energy coupling or supply for geometric reasons at a predetermined plasma power a self-bias-voltage to be measured at the substrate arises, which, depending on the basic material amounts to between 30 V and 1000 V, maximally 1500 V. Other kinds of excitation, also simultaneously from different energy sources, can also lead to a success, as long as during the growth of the layer, by the interaction of the plasma with the layer e.g. by means of ion bombardment, the diamond-like structure is created.

The electrical energy supply for producing the plasma individual excitations, or their combinations include direct-voltage, mono-polar and bi-polar direct-voltage pulse-techniques, and medium frequency (typically 30–60 kHz), high-frequency in the MHz-range (typically 13.56 MHz) and microwave-excitation at typically 2.45 GHz. The energy supply for producing the plasma is chosen such that the used gases and vapors are ionized and are deposited by means of an electrical field preferably in a diamond-like structure on the substrate surfaces, whereby with regard to high-frequency excitation the gas-discharging excitation frequency is adjusted within a range of 1 to 50 MHz, especially to 13.56 MHz.

The new colorating layers bring a decisive technical progress for the integrated coloration and surface finishing of practically any objects. Besides the wide color palette thus also wear resistance and corrosion resistance are usefully available. Thus, chromic armatures and chromic fittings can be produced without disadvantageous and often inadmissible varnishing measures in many colors by means of coating with the coating process of the predetermined thickness according to the invention. In addition, the advantage results that due to said coating the surface of the objects is bloomed in a wear resisting and corrosion resistant way. By increasing the colorating layer thickness or the layer portion, respectively, also more saddened shades of colors can be achieved. Thus, purposefully not the first but higher orders of the interference effect are used, so that due to interference of different interference effects different new color impressions of a higher depth of color can be adjusted and/or the brightness of colors is varied in the already described way.

Thus, it is possible to take also comparably cheap basic materials for fittings, armatures etc., which are coatable in any way according to the invention, to give them a desired color and, if necessary, to produce at the same time the hardness, corrosion and wearing resistance necessary for using them.

In the embodiments concerning the production of the layers according to the invention, a vacuum chamber was used, which was brought to the working pressure between 0.2 to 0.01 mbar by means of mechanical pumps. An evacuation with high-vacuum pumps was not necessary. Into said space the reaction mixture was introduced, whereby a dynamic balance appeared at the mentioned pressure value between the introduced quantity and the pumping capacity of the pump.

The vacuum chamber showed a volume of about 100 liters. For maintaining the electrical discharge in said volume and for producing the coating, a high-frequency power of about 100 to 300 watts was necessary. The optical thickness of the applied layers was determined by means of a mechanical measurement of thickness and by determining the refractive index of the layers.

For producing the coating the parts to be coated were supplied with high-frequency energy (13.56 MHz), whereby conductive parts were directly connected with the output of the high-frequency generator through an impedance matching, and insulating parts were provided with a metallic electrode arranged at the back in that also at their front surface to be coated the electric field of the high-frequency energy and their self-bias-voltage effected the chemical reaction in the gas phase and thus the production of layers.

In said chamber, in series experiments completely different parts (e.g. fittings, armatures, bearing parts) were coated homogeneously on all sides and with reproducable results. Chromium-plated and nickel-plated parts, parts of special steel, hardened steel, aluminium, other light metals, also with anodized surface, ceramics, brass and glass with dull or high-glass surfaces were coated with completely different layer thicknesses and also predetermined coloration and color shades. In the testing chamber the coating periods amounted for the described colorating layers with integrated protection against wearing to about 30 minutes.

Where the working gas is composed of ethine, hydrogen and hexamethyl-disiloxane with a molar mixture ration of 1:1:0.5 to 1:0.01:0.005, sucessfully especially wear resisting hard layers in the range of a thickness of about 3 $\mu$m to 8 $\mu$m were achieved, the hardness of which was above the hardness of titanium nitride layers. However, the invention is not restricted to said special gas compositions, but it is possible to add e.g. a component changing the refractive index, which does not influence hardness or only inconsiderably.

Even complicated, coated objects, such as e.g. door handles, show in a white light on all sides a satisfactory, homogeneous color impression.

As already mentioned, by adding silicon both the refractive index and the extinction of the diamond-like layer are influenced. The coating speed also changes due to the silicon addition.

With regard to the embodiments, usually after having changed the gas composition and/or the gas quantities, the electrical conditions of the energy supply were changed and especially adapted.

The limits for the coating parameters, however, can easily be determined empirically only in that it is controlled whether the color spectrum still is passed through or not. Said kind of controlling the layer thickness, without the need of determining their real thickness value and refractive index, has considerable advantages compared to the layer construction having a plurality of layers with iridescent effect as mentioned further above, as there the individual layer thicknesses have to be predetermined very exactly and they have to be adapted to each other. According to the invention it is easily possible as well to vary the thickness of the colorating coating or the region of the coating, respectively, locally when coating, e.g. by changing the geometrical relations in the chamber and by influencing the electrical high-frequency field in direct proximity in front of the object to be coated, so that a multi-colored object can be obtained or that purposeful colored transitions, color courses and/or colour patterns are produceable.

In contrast to the state of the art, the substrate is not heated. Connected therewith is a considerable saving of time, the selection of materials is considerably higher and there is no change in the dimensional accuracy. Thus, not only does the procedure become cheaper, but also sensitive substrates can be provided with colorating layers, and they can be protected very efficiently in addition.

The coatings according to the invention were produced in a vacuum recipient of glass having a volume of 120l with a wire netting sitting close to the interior of the recipient. The low pressure necessary for the operation was produced by a two-stage rotary vane pump LEYPOLD TRIVAC D65B having a subsequently connected turbomolecular pump TURBOVAC 1500. The working gases necessary for the coating (e.g. argon, ethine, hydrogen) were supplied into the device through thermic gas flow control devices of HI-TEC. The other necessary vapor of a silicon-organic compound (preferably HMDSO=hexamethyl disiloxane) were introduced through a special vapor-flow control device VACUUM GENERAL 80-55 having a heatable valve. The control of the gas pressure was performed by means of a vacuum measuring apparatus MKS BARATRON 270S being independent of the kind of gas. For the energy supply of the plasma discharging process a high-frequency transmitter with an operation frequency of 13,56 MHZ with an output of 1 kW ENI ACG-10 having an automatic matchbox ENI MW-10 was used. The matchbox was directly connected to a water-cooled plate electrode with a size of about 200 mm×300 mm within the discharging portion. The wire netting lining the recipient served as a large-area computer electrode for the discharging process. The component to be coated was fixed on the plate electrode with a good thermic and electrical contact. The surfaces to be coated were cleaned with a solvent (e.g. acetone, ethanole) in an ultrasonic bath before being inserted in the coating apparatus. Subsequently they were precisely cleaned in an isopropanol-vapor bath and dried. The layer thickness of the finished coating was measured in the form of a height of step at a layer edge which resulted by masking by means of a profilometer DEKTAK 3030ST.

COMPARISON EXAMPLE 1

Coating with a colorating layer system without increased wear resistance

The components intended to be coated, in this case preferably chromium-plated and high-polished brass films to be used as clockfaces, were installed in the coating device after the above-mentioned chemical cleaning process. Then, the recipient was pumped down to a starting gas pressure of less than 1 microbar. As a first step a plasma cleaning process of the component's surface in the argon plasma was performed. For this purpose about 240 ml/min of argon were introduced through a flow-meter, whereby a gas pressure of 40 microbar was achieved. In said gas atmosphere the components were cleaned and activated for 300 seconds in an high-frequency argon plasma of 100 Watt power. Then, in a second step, the colorating layer was applied. As in this comparison example 1 the wear resisting sub-layer of rather any thickness could be dispensed with, also the integrated reflection layer according to claim 1 and the integration of the colorating layer were omitted. For producing the colorating layer a gas stream of about 88 ml/min of ethine and 51 ml/min of hydrogen was adjusted after having pumped down the argon atmosphere. A numerically non-evaluable stream of a silicon-organic compound (HMDSO) was added to the resulting working pressure of 37 microbar until said working pressure had been increased to 46 microbar. Then, the layer-forming plasma discharging process was started with a power of 150 Watts, whereby a self-bias of about—400 Volts resulted. Already after a coating period of 2 seconds the addition of the silicon-organic compound was stopped and the coating process was continued for another 130 seconds. Thus, a thin layer suitable for the interference-coloration in a red-violet color resulted, the color impression of which changed into yellow from an inclined view. The produced layer consisted of a diamond-like carbon and resisted moderate wearing stress clearly better than the un-protected chromium layer, which soon showed scratching traces. The layer growing within the first two seconds served for the improvement of the adherence of the layer and for increasing the optical interference effects.

EXAMPLE 2

Coating with a colorating layer system with increased wearing resistance

The components intended to be coated, in this case preferably door handles of polished special steel, which at the same time had to be protected against wearing by means of the colorating layer, were inserted into the coating apparatus after the above-mentioned chemical cleaning process. Then, the recipient was pumped down to a starting gas pressure of less than 1 microbar. As the first step a plasma cleaning process of the surface of the components in the argon plasma was performed. For this purpose about 240 ml/min of argon were introduced through a gas flow control device, whereby a gas pressure of 40 microbar resulted. In said gas atmosphere said components were cleaned and activated in a high-frequency argon plasma with a power of 100 Watt for 300 seconds. Then, in a second step, the layer of diamond-like carbon protecting against wearing was applied. For producing said layer, a gas stream of about 78 ml/min of ethine and 46 ml/min of hydrogen were adjusted after having pumped down the argon atmosphere. A numerically non-evaluable stream of a silicon-organic compound (HMDSO) was added to the resulting working pressure of 28 microbar, until the working pressure had been increased to 36 microbar. Then, the layer-forming plasma discharging process with a power of 150 Watt was started, whereby a self bias of about—500 Volt resulted. During a coating period of 55 minutes thus a hard and wear resistant but black layer of siliceous, diamond-like carbon grew having a thickness of 8.5 micrometers. Then, in a third step, the reflection layer was produced by depositing diamond-like carbon within a period of 45 seconds based on the same adjustments, however, without an addition of silicon-organic compounds. Then, in a fourth step, on said pile of layers of siliceous and non-siliceous diamond-like carbon the colorating layer suitable for the interference was applied. The coating conditions were identical with those for producing the siliceous diamond-like carbon, whereas the colorating coating was deposited within 32 seconds. Due to this process a wear resistant layer having a thickness of 8.5 micrometers resulted with a thin layer component, which contains the layer region with a dark-blue color being suitable for the interference coloration.

The produced layer completely consisted of diamond-like carbon, the silicon content of which in a layer region close to the surface temporarily was reduced to zero. The complete layer also resisted very intensive wearing stress (tested in a vibratory grinding apparatus or in a trovalisation apparatus, respectively which corresponded to a permanent use of 20 years as a door handle) without any recognizable damages and without any delamination of the colorating layer from the wearing resistant layer.

We claim:

1. Method of producing a coating by means of a plasma-assisted chemical vapor deposition from gases and vapors having a carbonaceous and metalliferous gas phase of a first composition on a substrate surface in the form of a diamond-like, carbonaceous, metalliferous, and hydrogenous compound, characterized in that in a single plasma-assisted chemical vapor deposition process, in a region of the coating adjacent to the substrate surface, a non-colorating layer region, which comprises said diamond-like, carbonaceous, metalliferous, and hydrogenous compound and which provides hardness and wear resistance to the coating, is applied to a first thickness, that subsequent to deposition of said non-colorating layer region the parameters of the plasma-assisted chemical vapor deposition process are changed such that a portion of the coating applied after changing the parameters is created which possesses at least one gradient of either the composition of the portion of the coating or the refractive index of the portion of the coating, thereby causing an optical reflection boundary, wherein at the optical reflection boundary the plasma-assisted coating process is continued to deposit a colorating portion such that an optical thickness of said colorating portion is deposited with essentially the same mechanical characteristics as the non-colorating layer region of the coating and is controlled such that a desired color impression results at said colorating portion by interferences of the first order and/or of a higher order according to the principle of interference at thin films.

2. Method according to claim 1, characterized in that the non-colorating layer region is applied as an optically translucent portion.

3. Method according to claim 1, characterized in that the metal of the metalliferous compound for producing the coating is added in the form of a metal-organic silicon compound added to a carbon-metal-hydrogen compound.

4. Method according to claim 3, wherein the metal of the metalliferous compound for producing the coating is added as silicon.

5. Method according to claim 1, characterized in that, while producing the colorating portion the color impression of the coating passes through the color spectrum as the thickness of the colorating portion increases, said color impression being monitored as said thickness increases, and the coating is stopped as soon as a desired color impression is achieved.

6. Method according to claim 1, characterized in that the gases and vapors contain hydrogen and a member from the group consisting of alkane, alkene and alkine.

7. Method according to claim 1, characterized in that the gas pressure lies between 0.005 and 1 mbar when producing the colorating portion.

8. Method according to claim 7, wherein the gas pressure lies between 0.05 and 0.1 mbar.

9. Method according to claim 1, characterized in that the gases and vapors comprise ethine, hydrogen and hexamethyl-disiloxane with a molar mixture ratio of 1:1:0.5 to 1:0.01:0.005, whereby for producing differences between the non-colorating, hard and wear resistant base layer region and the colorating regions the composition of the working gas is changed within said ranges.

10. Method according to claim 1, characterized in that, for electrical energy for producing the plasma, individual excitations or their combination are used.

11. Method according to claim 1, characterized in that the energy supply for producing the plasma is chosen such that the gases and vapors are ionized and are deposited by means of an electrical field in a diamond-like structure on the substrate surface, wherein gas-discharging excitation frequency is adjusted within a range of 1 to 50 MHz.

12. Method according to claim 1, characterized in that, while producing the non-colorating layer region or the colorating layer portion of the coating, the thickness of said non-colorating layer region or the colorating layer portion is locally varied by changing the coating geometry, arrangement of electrodes and/or gas supply.

13. Method according to claim 1, characterized in that the coating is applied with a thickness of about 1 to about 10 $\mu$m.

14. Method according to claim 1, characterized in that the metalliferous gas phase contains a member selected from the group consisting of silicon and a metal forming compositions having hardness and lack of color similar to the hardness and lack of color of compositions formed by silicon.

15. Method according to claim 1, characterized in that the non-colorating layer region is applied as an optically non-translucent portion.

16. Method according to claim 1, characterized in that the optical reflection boundary is formed by varying, before reaching the complete thickness of the overall coating, at least one of the following parameters:

the composition of the vapors and gases, the supplied quantity of the vapors and gases, and characteristics of electrical energy used to produce plasma for the chemical vapor deposition.

17. Method according to claim 1, wherein the frequency of the layer-forming plasma discharging process is approximately 13.56 MHz.

18. Method according to claim 1, characterized in that a voltage between 100 V and 1500 V with respect to a burning plasma discharge is adjusted at the substrate.

19. Method according to claim 1, characterized in that the color of the coating is selected from a range of colors extending between light, bright colors and dark, saddened colors by varying at least one of (a) the refractive index of the portion of the coating applied after changing the parameters and (b) the thickness of the portion of the coating applied after changing the parameters.

20. Method according to claim 1, characterized in that the metal of the metalliferous compound for producing the coating is added as silicon.

21. Method according to claim 20, characterized in that the silicon in the metalliferous compound for producing the coating is in the form of a vapor from the group consisting of hexamethyl-disilane (HDMS), tetramethyl-silane, hexamethyl-disiloxane (HDMSO), tetraethoxisilane (TEOS) and tetramethyl-disilazine and is supplemented by other metalliferous gases or metal-organic vapors.

* * * * *